United States Patent [19]
Li et al.

[11] Patent Number: 5,245,583
[45] Date of Patent: Sep. 14, 1993

[54] INTEGRATED CIRCUIT MEMORY WITH DECODED ADDRESS SUSTAIN CIRCUITRY FOR MULTIPLEXED ADDRESS ARCHITECTURE AND METHOD

[75] Inventors: Li-Chun Li, San Jose; Hsing T. Tuan, Cupertino; Lynne Hannah, San Luis Obispo, all of Calif.

[73] Assignee: Vitelic Corporation, San Jose, Calif.

[21] Appl. No.: 679,511

[22] Filed: Apr. 2, 1991

[51] Int. Cl.⁵ .......................................... G11C 11/407
[52] U.S. Cl. .......................... 365/230.06; 365/230.02; 307/449; 307/463
[58] Field of Search ...................... 365/230.02, 230.06, 365/230.07, 230.08, 189.02; 307/568, 463, 554, 443, 548, 550

[56] References Cited
U.S. PATENT DOCUMENTS

| | | | |
|---|---|---|---|
| 5,027,008 | 6/1991 | Runaldue | 307/443 |
| 5,051,959 | 9/1991 | Nakano et al. | 365/230.06 |

Primary Examiner—Timothy P. Callahan
Attorney, Agent, or Firm—Flehr, Hohbach, Test, Albritton & Herbert

[57] ABSTRACT

An integrated circuit memory device is provided which includes a memory array including multiple memory cores, each core including a two-dimensional (x,y) array of memory cells, the memory array further including a plurality of x-lines and a plurality of y-lines; an address bus including a first bus oriented with a y-dimension and a second bus oriented with an x-dimension; and x-address generator; a y-address generator; a multiplexer circuit for operatively coupling one of the x-address generator and the y-address generator to the address bus; a plurality of y-address decoders each for producing decoded y-information to at least one of the plurality of y-lines; a plurality of separate x-address decoders each for producing decoded x-information for at least one of the plurality of x-lines; and a plurality of separate sustain circuits each for sustaining decoded x-information produced by at least one x-decoder.

12 Claims, 6 Drawing Sheets

INTEGRATED CIRCUIT MEMORY WITH DECODED ADDRESS SUSTAIN CIRCUITRY FOR MULTIPLEXED ADDRESS ARCHITECTURE AND METHOD

BACKGROUND OF THE INVENTION

Field of the Invention

The present invention relates generally to address decoding to provide memory cell coordinates in an integrated circuit memory array, and more particularly, to address decoding in an array which employs a multiplexed address architecture.

Description of the Related Art

Referring to the illustrative drawings of FIG. 1, there is shown a typical earlier memory array 13 which includes an arrangement of four memory cores 11-1 through 11-4 each of which includes a two-dimensional (x,y) array of individual memory cells 12. Each core 11-1 through 11-4 includes a plurality of x-lines and a plurality of y-lines. An individual cell 12 is addressed by simultaneously providing an activation signal on both the x-line and the y-line to which it is operatively coupled.

More specifically, an individual cell 12 of the memory array 13 is addressed by generating (x,y) address information to identify the addressed cell. The exemplary earlier memory array 13 of FIG. 1 uses a multiplexed address architecture. An x-address generator 16 produces multiple bits of x-dimension address information $A_x$, and a y-address generator 18 produces multiple bits of y-dimension address information $A_y$. Multiplexer 20 first selects the $A_x$ information and provides it on the address bus 14. The provided $A_x$ information is stored in latch circuits 22. Next, the multiplexer 20 selects the multiple bits of y-dimension address information $A_y$ and provides it on the main address bus 14. Upon provision of the $A_y$ information on the main address bus 14, the latch circuits 22 provide the stored $A_x$ information on a local bus 24. Thus, $A_x$ and $A_y$ information are simultaneously available on the two buses 14 and 24.

The $A_y$ information is separately decoded by each one of a plurality of y-address decoder circuits 26, each of which is operatively coupled to a different subset of the plurality of y-lines in the memory array 13. Similarly, the $A_x$ information is separately decoded by each one of a plurality of x-address decoder circuits 28, each of which is operatively coupled to a different one of the plurality of x-lines in the memory array 13.

The separate decoding of the $A_y$ information by each of the y-address decoder circuits 26 results in the provision of separate decoded y-information for each separate subset of y-lines. Similarly, the separate decoding of the $A_x$ information by each of the x-address decoder circuits 28 results in the provision of separate decoded x-information for each separate x-line. As a result of the decoding, at least one y-line and at least one x-line from at least one of the memory cores are selected. An addressed cell 12 is one that is operatively coupled to both a selected x-line and a selected y-line.

Referring now to the illustrative drawing of FIG. 2, there is shown a schematic diagram of a one bit latch element 22' from one of the two latch circuits 22 of FIG. 1. For a multiplexed address architecture which provides up to n/2 bits of $A_x$ information, the latch element 22' is repeated up to n/2 times in each of the two latch circuits 22. The structure and operation of the element 22' is explained in relation to the timing diagram of FIG. 3. When the $\overline{MUX}$ signal is in a "high" logic state and the MUX signal is in a "low" state, the ith bit of $A_x$ information $A_{xi}$ is input from the main address bus 14 through n-channel transistor 32. Since the MUX signal is in a "low" logic state, n-channel transistor 34 is disabled. Thus, $A_{xi}$ is fed into the one bit latch 36. Before the appearance of y-dimension address information $A_{yi}$ on the main address bus 14, the $\overline{MUX}$ signal transitions to "low" and disables n-channel transistor 32, and the MUX signal transitions to "high" which activates n-channel transistor 34. Thus, $A_{xi}$ is stored, or sustained, in the latch circuit 36. Lines 38, 40 provide $A_{xi}$ and $\overline{A}_{xi}$ to the local x-address bus 24.

The illustrative drawings of FIG. 4 shows details of a representative one of the x-address decoder circuits 28 of the memory array 13. The structure and operation of decoder circuit 28 is explained in relation to the timing diagram of FIG. 3. Prior to the commencement of a memory access cycle, the three x-dimension address signals ($A_{x1}$, $A_{x2}$, $A_{x3}$) and precharge signal $\overline{D}$ all are in "low" states. Consequently, n-channel transistors 44, 46, 48 are cut-off, and p-channel transistor 50 is activated causing $X_{OUTi}$ to be pulled up to a "high" state. The "high" state of $X_{OUTi}$ indicates that the x-line to which $X_{OUTi}$ is coupled has not been selected. At the start of the memory access cycle, precharge signal $\overline{D}$ transitions to a "high" state causing p-channel transistor 50 to become cut-off. Inverter 52 provides a "low" state signal to p-channel transistor 54 which maintains the $X_{OUTi}$ signal in a "high" state. During the memory access cycle, transistors 44, 46 and 48 together act as a decoder. When the inputs ($A_{x1}$, $A_{x2}$, $A_{x3}$) all are in "high" states, $X_{OUTi}$ transitions to a "low" state to indicate that the x-line to which decoder circuit 28 is coupled has been selected. Otherwise, $X_{OUTi}$ remains in the "high" state indicating that the coupled x-line has not been selected. Signal $X_{OUTi}$ represents the decoded x-information for the x-line to which circuit 28 is coupled.

The decoder circuit 28 shown in FIG. 4 is merely representative. Each of the x-address decoder circuits 28 of the memory array 13 can receive a different combination of inputs from the local x-address bus 24. Consequently, different x-lines can be activated by the appearance of different $A_x$ information on the local bus 24. Of course, it is also possible to implement the memory array 13 such that multiple x-lines are activated by the same $A_x$ information in order to achieve simultaneous access to multiple cells 12, although no more than one x-line can be activated in each of 11-1, 11-2, 11-3 and 11-4.

The use of a multiplexed address architecture advantageously reduces the number of external pins required to address individual cells within the memory array 13. Furthermore, for example, in a memory array that requires n/2 bits of y-dimension address information and n/2 bits of x-dimension address information to address an individual cell, the main bus 14 need only conduct no more than n/2 bits of x or y dimension information at a time. Thus, the main bus can be made narrower so that it occupies less die area.

While a multiplexed address architecture of the general type described above generally has been acceptable, there have been shortcomings with its use. In particular, the latch circuits 22 typically have been relatively large in size. This is due at least in part to the need for the latch circuits 22 to overcome the relatively large capacitance which can occur on the local address bus. Unfortunately, the relatively large size of the latch circuits 22 results in their occupying a relatively large amount of die area in the memory array 13, especially in the crowded region where the main bus 14 and the local bus 24 cross paths.

Another problem has been that, during times when such latches 22 are used to sustain $A_x$ information on the local bus 24, that local bus is not available to conduct $A_y$ information. Thus, the placement of the latches 22 at the intersection of the main bus 14 and the local bus 24 can reduce memory array layout flexibility in terms of placement of circuitry such as the y-address generator 16 which ordinarily must be positioned relative to the main bus 24 such that it can access the main bus 14 while the latches 22 sustain $A_x$ information on the local bus 24. Also, such placement of latches 22 can reduce the flexibility in placement of external logic 29 relative to address generators 16, 18.

Thus, there has been a need for an integrated circuit memory array in which circuit elements used to sustain $A_x$ information are relatively small in size, do not unduly interfere with the provision of $A_y$ information on main or local buses, and do not unduly limit memory array layout options. The present invention meets these needs.

SUMMARY OF THE INVENTION

In one aspect, the invention provides an integrated circuit memory device which includes a memory array having multiple memory cores. Each core includes a two-dimensional (x,y) array of memory cells. The memory array further includes a plurality of x-lines and a plurality of y-lines. An address bus, which includes a first bus oriented with a y-dimension and a second bus oriented with an x-dimension is used to address memory cells of the memory array. An x-address generator produces x-dimension address information, and a y-address generator produces y-dimension address information. A multiplexer alternately operatively couples one of the x-address generator and the y-address generator to the address bus. The device further includes a plurality of y-address decoders, each of which is responsive to y-dimension address information provided on the address bus. Each y-address decoder produces decoded y-information to at least one of the plurality of y-lines. Each of a plurality of separate x-address decoders is responsive to x-dimension address information provided on the address bus. Each x-address decoder produces decoded x-information for at least one of the plurality of x-lines. Each of a plurality of separate sustain circuits sustains decoded x-information produced by the x-decoders.

In another aspect, the present invention provides a new method for addressing memory cells of an integrated circuit memory device. The method includes the steps of providing x-dimension address information on an address bus. The x-dimension address information is decoded for each of a plurality of x-lines of the memory device so as to produce respective decoded x-information for each of the plurality of x-lines. The decoded x-information is sustained for each of the plurality of x-lines. While the decoded x-information is being sustained, y-dimension address information is provided on the address bus. The y-address information is decoded for each of the plurality of y-lines so as to produce decoded y-information for each of the respective y-lines.

Thus, through the use of sustain circuitry for sustaining decoded x-information, the need for relatively large latch circuits for storing x-dimension address information is avoided. Moreover, the use of such sustain circuitry permits the usage of both the x-branch and the y-branch of the address bus to conduct y-dimension address information during the sustaining of decoded x-information.

These and other features and advantages of the present invention will become more apparent from the following description of exemplary embodiments thereof, as illustrated in the accompanying drawings.

BRIEF DESCRIPTION OF THE DRAWINGS

The purpose and advantages of the present invention will be apparent to those skilled in the art from the following detailed description in conjunction with the appended drawings in which.

DETAILED DESCRIPTION OF THE PREFERRED EMBODIMENT

The present invention comprises a novel integrated circuit memory array and associated method. The following description is presented to enable any person skilled in the art to make and use the invention, and is provided in the context of a particular application and its requirements. Various modifications to the preferred embodiment will be readily apparent to those skilled in the art, and the generic principles defined herein may be applied to other embodiments and applications without departing from the spirit and scope of the invention. Thus, the present invention is not intended to be limited to the embodiment shown, but is to be accorded with the widest scope consistent with the principles and features disclosed herein.

Figure 1:
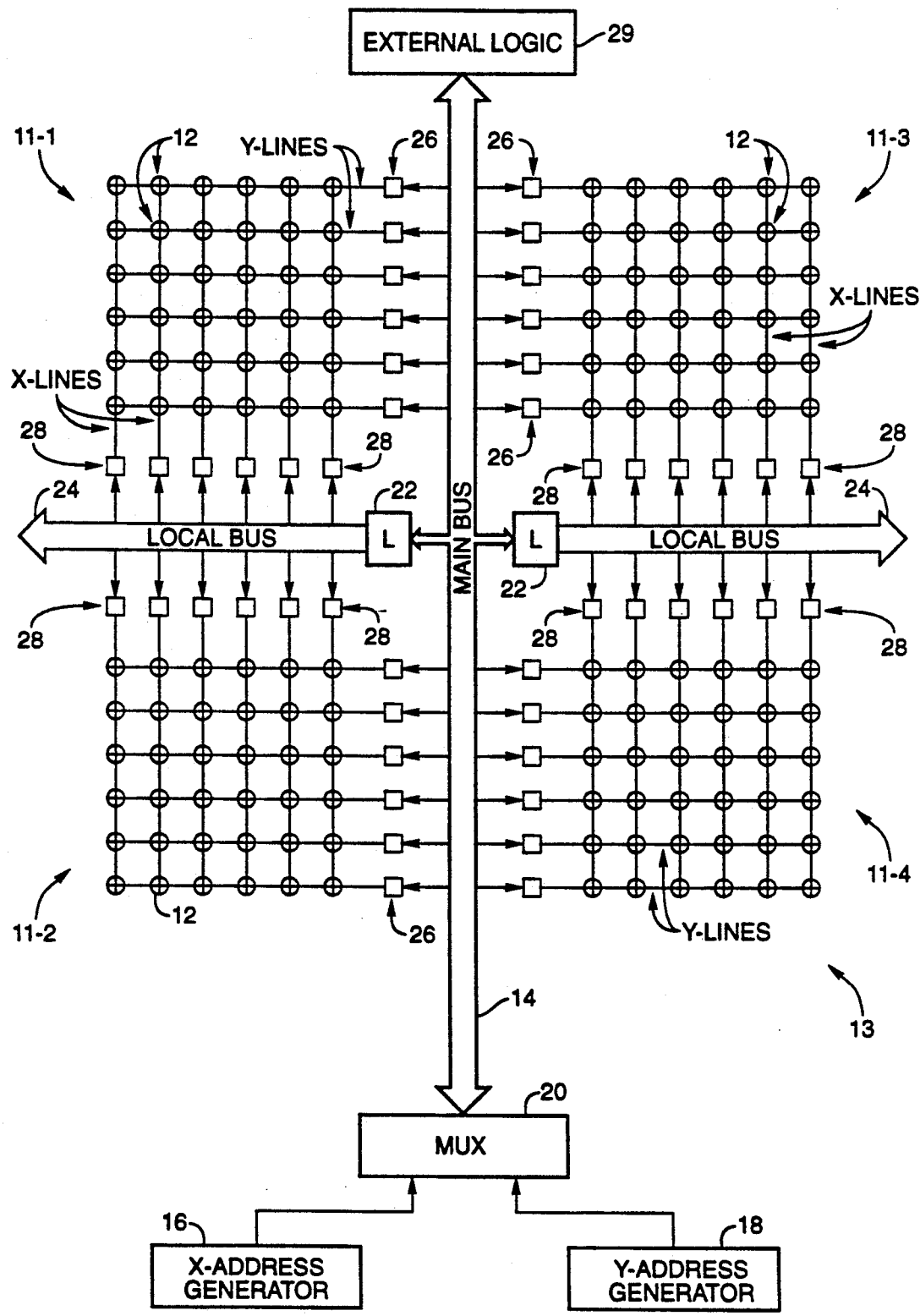
FIG. 1 is an illustrative block diagram of a conventional memory array which uses a multiplexed address architecture.
Figure 2:
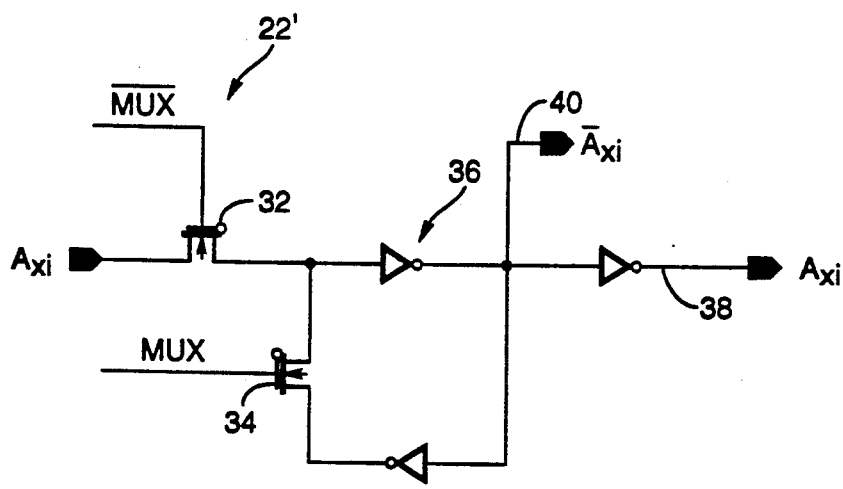
FIG. 2 is an illustrative schematic diagram of a one bit latch element of the latch circuits of the memory array of FIG. 1.
Figure 4:
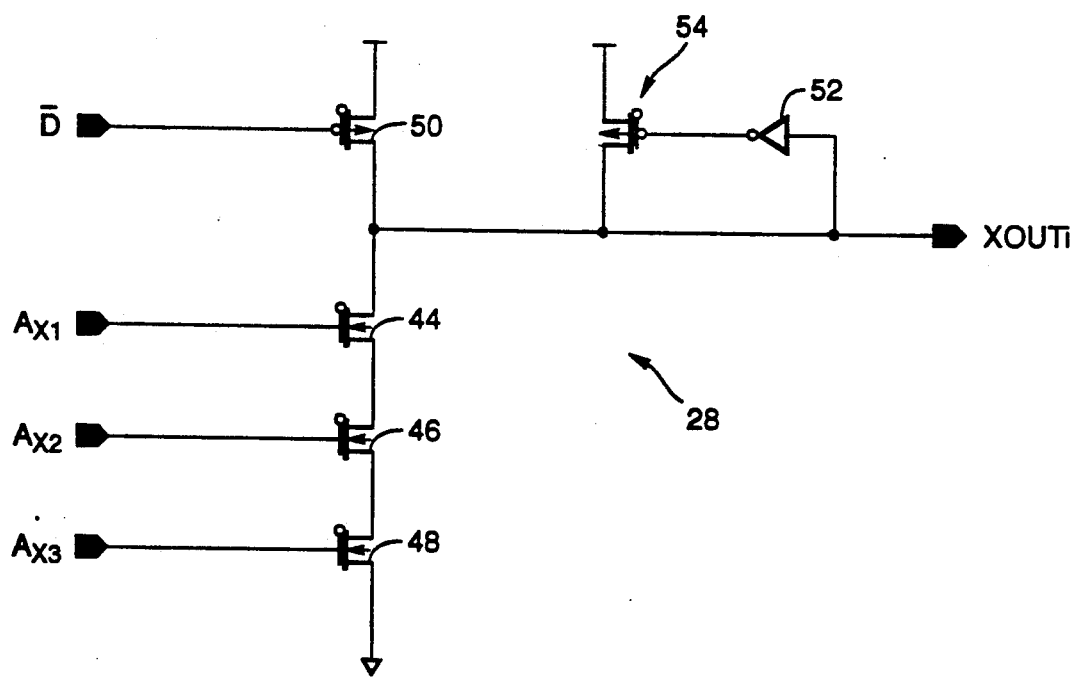
FIG. 4 is an illustrative drawing of a conventional x-decoder circuit used in the array of FIG. 1.
Figure 3:
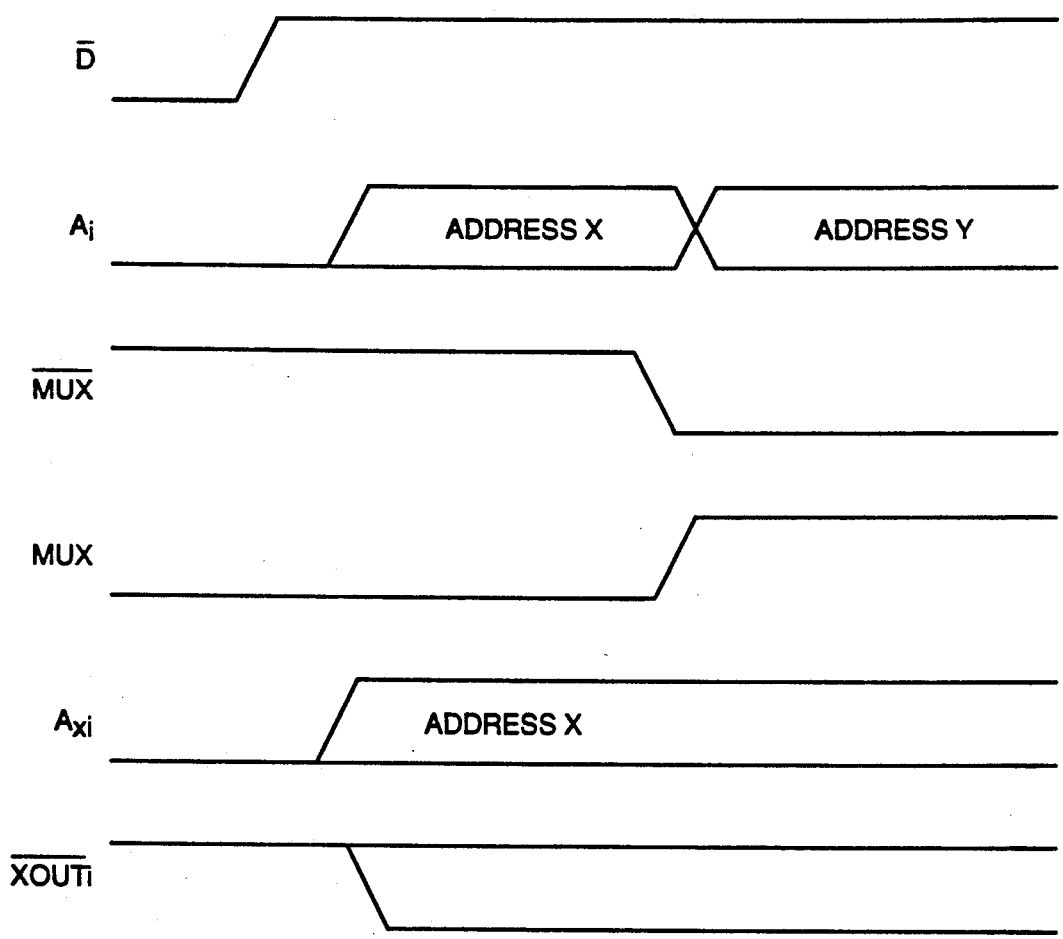
FIG. 3 is an illustrative timing diagram which shows the memory access timing for the array of FIG. 1.
Figure 5:
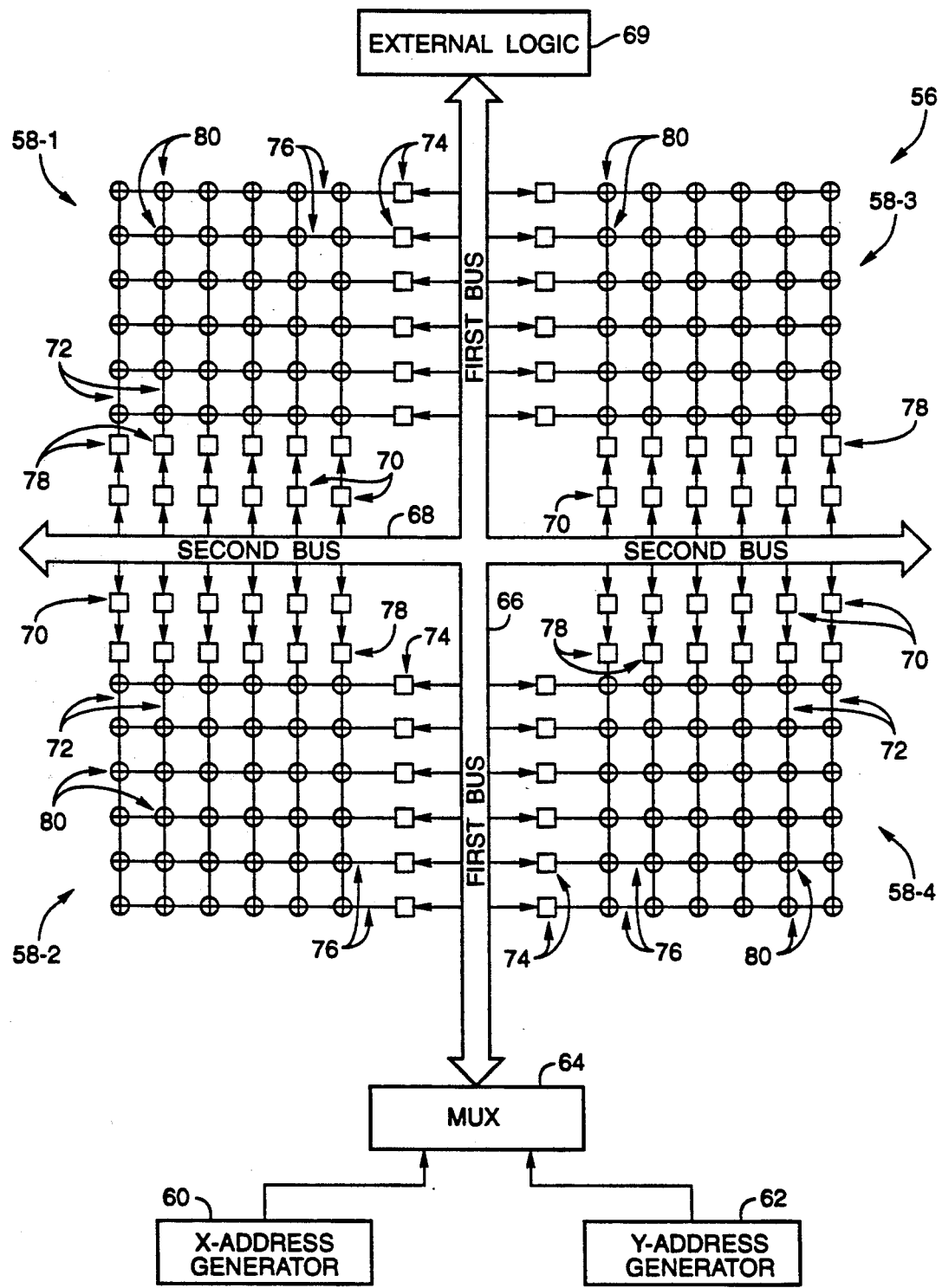
FIG. 5 is an illustrative drawing of a memory array in accordance with the present invention.
Figure 8:
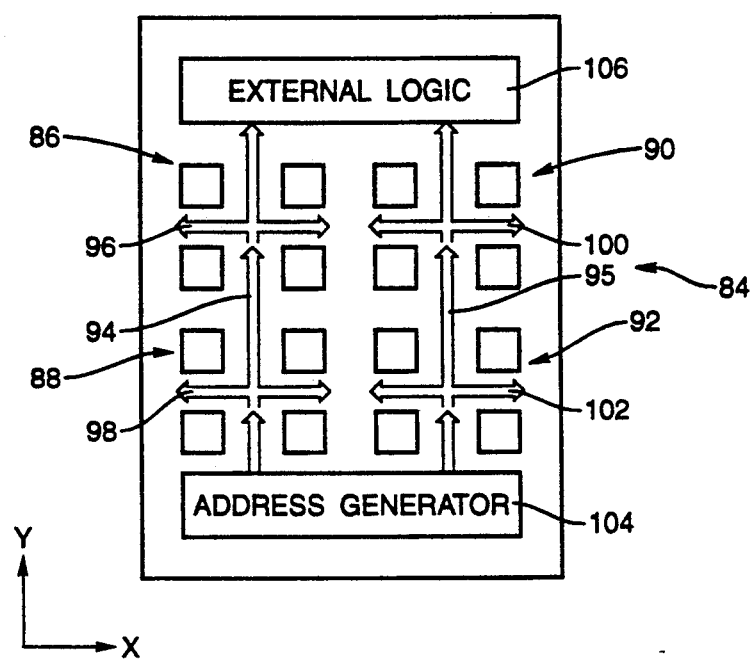
FIG. 8 is an illustrative drawing of a layout of multiple four-core arrays of the type shown in FIG. 5.
Figure 9:
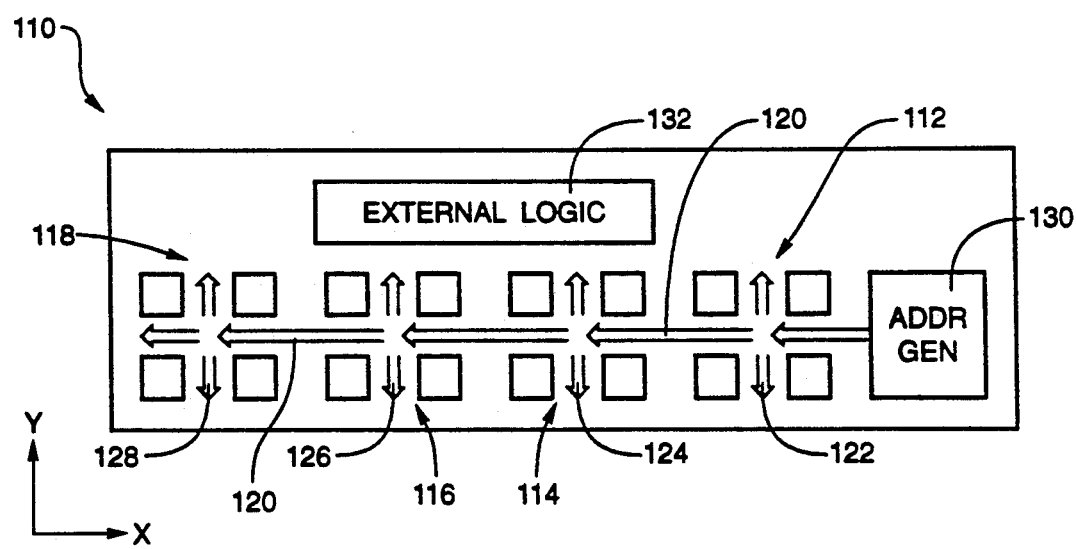
FIG. 9 is an illustrative drawing of an alternate layout of multiple four-core arrays of the type shown in FIG. 5.

Referring to the illustrative drawings of FIG. 5, there is shown a memory array 56 in accordance with the present invention. In the currently preferred embodiment the memory array is implemented as a DRAM. However, it could be implemented as an SRAM or other class of memory array. The array 56 includes four memory cores 58-1, through 58-4 arranged as shown. As shown in FIGS. 8 and 9, this four core layout can be repeated numerous times in an integrated circuit. The cores are interconnected with an x-address generator 60 and a y-address generator 62 through multiplexer 64 via first a branch address bus 66 and a second second branch address bus 68. The external logic 69 (which forms no part of the invention) can include input-output circuitry, clock generators, refresh timing and other control circuitry.

A plurality of separate x-address decoders 70 are separately connected between individual x-lines 72 and the second address bus 68. A plurality of separate y-address decoders 74 are separately connected between individual y-lines 76 and the first address bus 66.

A plurality of separate sustain circuits 78 separately interconnect individual x-address decoders 70 and individual -lines 72. The individual sustain circuits 78 separately sustain decoded x-information for each different x-line 72. More particularly, for each x-line 72, a separate x-address decoder 70 decodes x-dimension address information provided on the second address bus 68, and a separate sustain circuit 78 locally sustains the decoded x-information produced by its corresponding decoder 70.

Thus, the memory array 56 of the present invention advantageously uses a plurality of individual sustain circuits 78 which can be physically small because they need not overcome capacitance which may occur on the second address bus 68. Moreover, the individual sustain circuits 78 do not interfere with the later provision of y-address information on the first or second address buses 66, 68. Consequently, as explained more fully below, y-address information can be conducted on the second bus 68 while the individual sustain circuits 78 locally sustain decoded x-information for their individual x-lines.

In operation, the x-address generator 60 and y-address generator 62 are alternately connected to the first address bus 66 through multiplexer 64. During a x-memory access cycle, first the X-address generator 60 is connected to the first address bus 66, and no more than n/2 bits of X-dimension address information $A_x$ appears on the first and second address buses 66, 68. X-dimension address information on the second address bus 68 is separately input to the separate x-address decoders 70. Each decoder 70 separately decodes the information input to it, and separately produces its own decoded x-information. For each decoder 70, a corresponding separate sustain circuit 78 locally sustains the decoded x-information. After the decoding, each decoder 70 is operatively disconnected from the second address bus 68.

Where an individual decoder 70 produces decoded x-information indicating that its x-line has been selected, then the corresponding sustain circuit 78 coupled to that x-line provides a signal causing each individual cell 80 coupled to such selected line to become activated. The sustain circuit 78 sustains such activation signal during the provision of corresponding y-dimension address information on the first and second buses 66,68.

While the individual storage circuits 78 separately sustain the decoded x-information for each separate x-line 72, the multiplexer 64 connects the y-address generator 62 to the first address bus 66, and the y-dimension address information $A_y$ appears on the first and second address buses 66, 68. The appearance of the Y-dimension information address does not affect the sustained decoded x-information because the separate x-address decoders 70 are operatively disconnected from the buses 66, 68. Upon receiving the Y-dimension address information, the separate y-address decoders 74 separately decode y-dimension address information input from the first bus 66, and separately produce decoded y-information.

The decoded y-information for each y-line 76 indicates whether or not that y-line has been selected. A memory cell 80 operatively coupled to both a selected x-line 72 and a selected y-line 76 is accessed via the first bus 66 and the external logic 69. Thus, the sustain circuits 78 separately sustain decoded x-information that indicates which x-lines are selected. While the sustain circuits 78 continue to sustain the decoded x-information, the y-address decoders 74 decode y-address information $A_y$ to determine which memory cells 80 from activated x-lines 72 are to be accessed.

Thus, the y-address decoders 74 and the sustain circuits 78 cooperate to provide two dimensional addresses which simultaneously activate selected x-lines 72 and selected y-lines 76, such that individual memory cells 80 operatively coupled to both a selected x-line and a selected y-line can be accessed. It will be appreciated that the memory array 13 can be implemented such that multiple memory cells 80 can be accessed simultaneously. For example, decoding of x-dimension address information could simultaneously activate multiple x-lines 72, although not within the same core. Core 58-1 may only have one activated x-line, as may cores 58-2, 58-3 and 58-4. While such multiple selected x-lines are separately sustained in a selected state by separate sustain circuits 78, corresponding y-dimension address information could be decoded which results in the selection of multiple y-lines 76 and the accessing of multiple memory cells 80. It will be appreciated that the terms x and y are used merely for convenience since the array 13 has two-dimensions.

Figure 6:
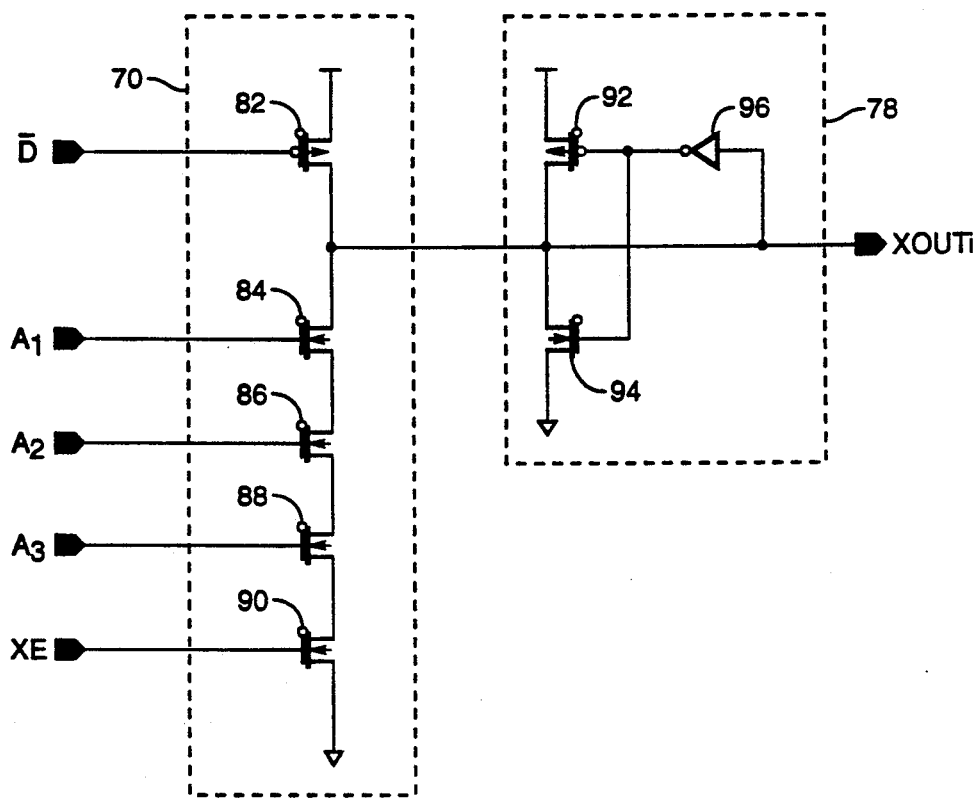
FIG. 6 is an illustrative schematic diagram of a decoder circuit and sustain circuit of the memory array of FIG. 5.

Referring to the illustrative drawings of FIG. 6, there is shown a representative one of the plurality of x-address decoders 70 and its corresponding sustain circuit 78. The representative x-address decoder 70 includes a p-channel precharge transistor 82, three n-channel decoding transistors 84, 86, 88 and an n-channel enabling/disabling transistor 90. The sustain circuit 78 includes a p-channel pull-up transistor 92, an n-channel pull-down transistor 94 and an inverter 96.

The gates of the decoding transistors 84, 86, 88 are coupled to receive three individual address signals ($A_{x1}$, $A_{x2}$, $A_{x3}$) from the second address bus 68. The $X_{OUTi}$ line of the storage circuit 78 is coupled to one of the x-lines 72.

Figure 7:
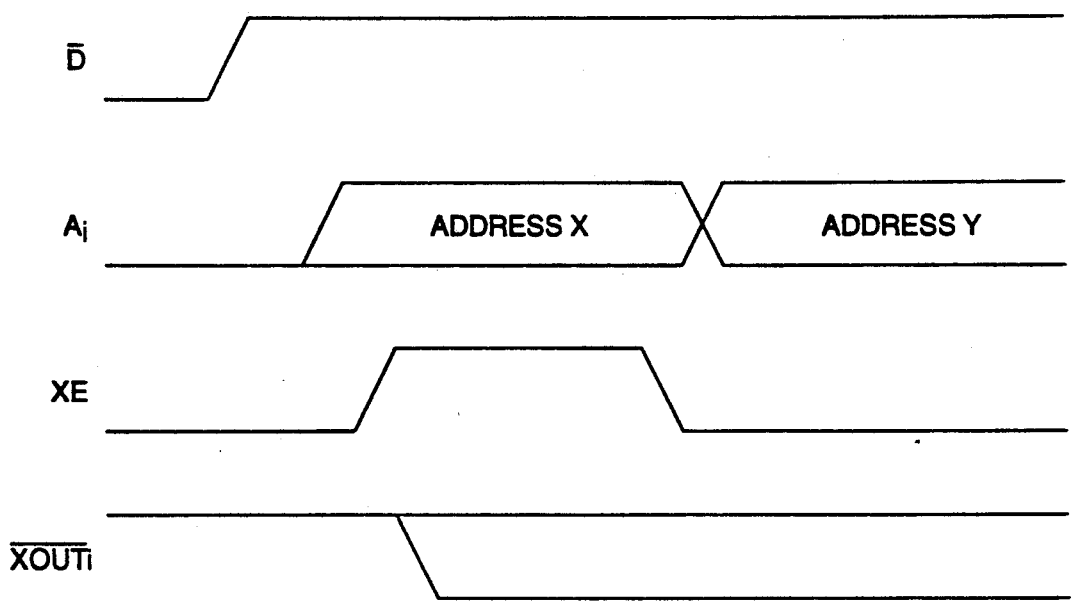
FIG. 7 is an illustrative timing diagram which shows memory access timing for the array of FIG. 5.

The operation of the representative decoder 70 and sustain circuit 78 are explained with reference to the timing diagram of FIG. 7. Before the start of a memory access cycle, precharge signal $\overline{D}$ and dis/enabling signal XE are "lows". Thus, the four n-channel transistors 84, 86, 88, and 90 are cut-off, and the p-channel transistor 82 pulls up $X_{OUTi}$ to "high" indicating that the x-line coupled to the decoder 70 and sustain circuit 78 is not selected. During a memory access cycle, indicated by a "high" logical state of the precharge signal $\overline{D}$, the p-channel transistor 82 is cut-off. The invertor 96 feeds back the inverted "high" $X_{OUTi}$ signal which activates p-channel pull-up transistor 92 which provides pull-up to sustain the "high" output at the $X_{OUTi}$. During the provision of x-dimension address information $A_x$ on the second bus 68, signal XE transitions to "high", and turns on transistor 90. If the x-line 72 corresponding to decoder 70 is selected, all three one bit x-dimension address signals ($A_{x1}$, $A_{x2}$, $A_{x3}$) will be "highs", and the $X_{OUTi}$ will be pulled down to "low" because all four n-channel transistors of the decoder 70 will be turned on. Otherwise, $X_{OUTi}$ remains in the "high" (nonselected) state. Thus, signal $X_{OUTi}$ represents the decoded x-information for the x-line coupled to decoder 70 and sustain circuit 78.

After the provision of the $A_x$ address information on the second bus 68, XE transitions to "low" and remains in the "low" state while the y-dimension address information $A_y$ is provided on the first bus 66. Transistor 90 is turned off because signal XE is in a "low" state. Thus, the decoder 70 is operatively disconnected from the second bus 68 during the provision of the $A_y$ address information. Moreover, invertor 96 provides an inverted "low" $X_{OUTi}$ to activate pull-down n-channel transistor 94 which pulls down the output at the $X_{OUTi}$ to a low state when the decoder 70 has been selected. Otherwise, $X_{OUTi}$ remains in the nonselected "high" state. In summary, a "high" logical state of the decoded x-information signal $X_{OUTi}$ is sustained by transistor 92, and a "low" logical state of the decoded x-information signal $X_{OUTi}$ is sustained by transistor 94.

Referring to the illustrative drawings of FIG. 8, there is shown a first integrated circuit device 84 which includes four four-core memory arrays 86, 88, 90, 92 in accordance with the invention arranged in a first layout. Memory arrays 86 and 88 are accessed by bus 94 which is oriented in the y dimension. Memory arrays 88 and 90 are accessed by bus 95 which is oriented in the y-dimension. Arrays 86, 88, 90, 92 also are respectively accessed by respective buses 96, 98, 100, 102 oriented in the x-dimension. Address generation circuitry 104 such as address decoders and multiplexers (not shown) is disposed along one edge of the device 84. External logic 106 such as I/O control circuitry (not shown) is disposed along an edge of the device 84 opposite the address generation circuitry 104. The device 84 can be easier to design because there is more space at the intersections of the buses oriented with the x-dimension and the y-dimension due to the absence of large latch circuits at these intersections.

Referring to the illustrative drawings of FIG. 9, there is shown a second integrated circuit device 110 which includes four four-core memory arrays 112, 114, 116, 118 in accordance with the invention arranged in a second layout. The memory arrays 112, 114, 116, 118 are accessed by bus 120 oriented in the x-dimension. The memory arrays 112, 114, 116, 118 also are respectively accessed by respective buses 122, 124, 126, 128 oriented in the y-dimension. Address generation circuitry 130 is disposed along an edge of the device 110. External logic 132 is disposed along an edge of the device 110 adjacent the address generation circuitry 130.

In the device 110, $A_y$ may be provided along the x-dimension bus 120. It will be appreciated that in a conventional approach $A_y$ ordinarily would be provided on busses 122, 124, 126 and 128, which would require physical placement of address generators along the top or bottom of the device 110. Unfortunately, such placement could be a problem due to die size requirements of standard I.C. packages—i.e., the device 110 might be too wide to fit in a standard package. Alternatively, the conventional approach could provide $A_y$ on an additional bus running parallel to bus 120, but again this could increase the die size. The present invention, therefore, allows the flexibility of providing $A_y$ along either an x-dimension bus or a y-dimension bus from whichever periphery location better meets overall design requirements.

While a particular embodiment of the invention has been described in detail, it will be understood that the invention may be implemented through alternative embodiments. Thus, the scope of the invention is not intended to be limited to the embodiment described above, but is to be defined by the appended claims.

What is claimed is:

1. In an integrated circuit memory device which includes, a memory array including multiple memory cores, each core including a two-dimensional (x,y) array of memory cells, the memory array further including a plurality of x-lines and a plurality of y-lines; an address bus for addressing memory cells of the memory array, the address bus including a first bus oriented with a y-dimension and a second bus oriented with an x-dimension; an x-address generator for generating and temporarily asserting x-dimension address information; a y-address generator for generating and temporarily asserting y-dimension address information; and multiplex means for alternately operatively coupling one of the x-address generator and the y-address generator to the address bus, an improved address decoding apparatus comprising:

a plurality of y-address decoders, each responsive to y-dimension address information provided on the address bus and each for producing decoded y-information to at least one of the plurality of y-lines;

a plurality of separate x-address decoder means, each responsive to x-dimension address information provided on the address bus and each for producing decoded x-information for at least one of the plurality of x-lines, said decoded x-information having a first signal level on at least one of said x-lines selected by said asserted x-dimension address information and having a second signal level on all others of said plurality of x-lines; and a plurality of separate means, each operatively coupled to at least one of said plurality of x-address decoder means, for sustaining, after said x-address generator stops temporarily asserting said x-dimension address information, said first signal level on said at least one x-line and said second signal level on said other x-lines.

2. The apparatus of claim 1 wherein each of said separate x-address decoder means produces decoded x-information for a different one of the x-lines.

3. The apparatus of claim 1 wherein each of said separate sustain means is operatively coupled to a different one of said plurality of separate x-address decoder means.

4. In an integrated circuit memory device which includes, a memory array including multiple memory cores, each core including a two-dimensional (x,y) array of memory cells, the memory array further including a plurality of x-lines and a plurality of y-lines; an address bus for addressing memory cells of the memory array, the address bus including a first bus oriented with a y-dimension and a second bus oriented with an x-dimension; an x-address generator for producing x-dimension address information; a y-address generator for producing y-dimension address information; and multiplex means for alternately operatively coupling one of the x-address generator and the y-address generator to the address bus, an improved address decoding apparatus comprising:

a plurality of y-address decoders, each responsive to y-dimension address information provided on the address bus and each for producing decoded y-information to at least one of the plurality of y-lines;

a plurality of separate x-address decoder means, each responsive to x-dimension address information provided on the address bus and each for producing decoded x-information for at least one of the plurality of x-lines;

a plurality of separate means, each operatively coupled to at least one of said plurality of x-address decoder means, and each for sustaining decoded x-information produced by said at least one x-decoder means to which it is operatively coupled; and disconnect means for operatively disconnecting said plurality of separate x-address decoder means from the address bus during a provision of y-dimension address information on the address bus.

5. The apparatus of claim 4 wherein said disconnect means includes:

a plurality of separate disconnect means, each operatively connected to a separate one of said plurality of separate x-address decoder means, and each for operatively disconnecting said x-address decoder means to which it is connected from the address bus during a provision of y-dimension address information on the address bus.

6. The apparatus of claim 1 wherein:

each of said separate x-address decoder means produces decoded x-information for a different one of the x-lines; and each of said separate sustain means is operatively coupled to a different one of said plurality of separate x-address decoder means.

7. The apparatus of claim 5 wherein:

each of said separate x-address decoder means produces decoded x-information for a different one of said x-lines; and each separate sustain means is operatively coupled to a different one of said plurality of separate x-address decoder means.

8. For use with an integrated circuit memory device which includes, at least one memory core including a two-dimensional (x,y) array of memory cells and a plurality of x-lines and a plurality of y-lines; an address bus which includes a first branch bus oriented with a y-dimension and a second branch bus oriented with an x-dimension; an x-address generator for generating and temporarily asserting x-dimension address information; a y-address generator for generating and temporarily asserting y-dimension address information; and multiplex means for alternately operatively coupling one of the x-address generator and the y-address generator to the address bus, a method for addressing the memory cells of the memory core comprising the steps of:

providing the x-dimension address information to the address bus;

for each of the plurality of x-lines, decoding the x-dimension address information so as to determine which of the plurality of x-lines has been selected;

for each of the plurality of x-lines which is selected, producing decoded x-information having a first signal level;

for each of the plurality of x-lines which is not selected, producing decoded x-information having a second signal level;

sustaining said first and second signal levels after said x-dimension address information has been temporarily asserted;

during said step of sustaining providing the y-dimension address information to the address bus; and for each of the plurality of y-lines, decoding the y-dimension address information so as to produce respective decoded y-information for each of the respective y-lines.

9. The method of claim 8 wherein said step of decoding the x-dimension address information includes producing separate decoded x-information for each of the plurality of x-lines.

10. The method of claim 8 wherein said step of sustaining includes separately sustaining decoded x-information for each of the plurality of x-lines.

11. The method of claim 8 wherein said step of providing the y-dimension address information includes providing the y-dimension address information on both the first branch bus and the second branch bus.

12. For use with an integrated circuit memory device which includes, at least one memory core including a two-dimensional (x,y) array of memory cells and a plurality of x-lines and a plurality of y-lies; an address bus which includes a first branch bus oriented with a y-dimension and a second branch bus oriented with an x-dimension; an x-address generator for producing x-dimension address information; a y-address generator for producing y-dimension address information; and multiplex means for alternately operatively coupling one of the x-address generator and the y-address generator to the address bus, a method for addressing the memory cells of the memory core comprising the steps of:

providing the x-dimension address information to the address bus;

for each of the plurality of x-lines, decoding the x-dimension address information so as to produce respective decoded x-information for each of the plurality of x-lines;

for each of the plurality of x-lines, sustaining the respective decoded x-information for that x-line;

during said step of sustaining providing the y-dimension address information to the address bus;

for each of the plurality of y-lines, decoding the y-dimension address information so as to produce respective decoded y-information for each of the respective y-lines;

operatively disconnecting the second branch bus from each of the plurality of x-lines during said step of providing the y-dimension information to the address bus; and wherein said step of providing the y-dimension address information includes providing the y-dimension address information on both the first branch bus and the second branch bus.

* * * * *